(12) United States Patent
Yang

(10) Patent No.: US 10,839,985 B2
(45) Date of Patent: Nov. 17, 2020

(54) INTEGRATED OUTPUT LINE AND ANTENNA SYSTEM USING SAME

(71) Applicant: SHENZHEN ANTOP TECHNOLOGY LIMITED, Guangdong (CN)

(72) Inventor: Ruidian Yang, Guangdong (CN)

(73) Assignee: SHENZHEN ANTOP TECHNOLOGY LIMITED, Shenzhen (CN)

( * ) Notice: Subject to any disclaimer, the term of this patent is extended or adjusted under 35 U.S.C. 154(b) by 0 days.

(21) Appl. No.: 16/205,877

(22) Filed: Nov. 30, 2018

(65) Prior Publication Data
US 2019/0355493 A1 Nov. 21, 2019

(30) Foreign Application Priority Data
Apr. 25, 2018 (CN) ........................ 2018 2 0601282 U

(51) Int. Cl.
| | |
|---|---|
| *H01Q 1/24* | (2006.01) |
| *H01Q 1/46* | (2006.01) |
| *H05K 9/00* | (2006.01) |
| *H01B 7/282* | (2006.01) |
| *H01B 7/18* | (2006.01) |

(52) U.S. Cl.
CPC ............ *H01B 7/282* (2013.01); *H01B 7/18* (2013.01); *H01Q 1/247* (2013.01); *H01Q 1/46* (2013.01); *H05K 9/0098* (2013.01)

(58) Field of Classification Search
CPC ........ H05K 9/0098; H01Q 1/247; H01Q 1/46; H01B 9/003; H01B 7/282; H01B 7/18
See application file for complete search history.

(56) References Cited

U.S. PATENT DOCUMENTS

| | | | | |
|---|---|---|---|---|
| 6,185,155 B1* | 2/2001 | Steinich | ................ | G01B 17/00 367/140 |
| 6,973,328 B1* | 12/2005 | Suematsu | ............... | H03J 1/005 370/343 |
| 7,539,379 B2* | 5/2009 | Khoshaba | ............ | G02B 6/4416 385/100 |
| 2006/0079290 A1* | 4/2006 | Seto | ..................... | H01Q 3/2605 455/562.1 |

* cited by examiner

*Primary Examiner* — Dimary S Lopez Cruz
*Assistant Examiner* — Michael M Bouizza
(74) *Attorney, Agent, or Firm* — Muncy, Geissler, Olds & Lowe, P.C.

(57) ABSTRACT

The invention provides an integrated output line and an antenna system using the same. The integrated output line includes a jacket, a power supply line, and a signal output line. The power supply line and the signal output line are disposed through the jacket. The power supply line and the signal output line are combined and output through the jacket. Thus, the generation of gaps between the two lines caused by the two lines in separate wiring is avoided, thereby the water resistance is improved and the installation of the lines after combination becomes easier, which is time-saving and labor-saving. The antenna system using the integrated output line further includes an antenna, an antenna amplifier, and a power source module. The antenna, the antenna amplifier, and the signal output line are connected in sequence. The antenna amplifier, the power source module, and the power supply line are connected in sequence.

8 Claims, 1 Drawing Sheet

INTEGRATED OUTPUT LINE AND ANTENNA SYSTEM USING SAME

TECHNICAL FIELD

The invention relates to the field of antenna line optimization, and in particular to an integrated output line and an antenna system using the same.

BACKGROUND ART

If a general antenna containing only metal and medium also contains active devices such as a crystal triode, a tunnel diode, or a varactor diode, the general antenna will become an active antenna, which can improve the performance of an electrically small antenna. The active devices in the active antenna may be directly mounted into the antenna, or may connect the antenna and an amplifier to form an antenna system. The general antenna equipped with the active devices can improve the impedance of the electrically small antenna, broaden the frequency band, and improve the noise characteristics of the system, etc. Therefore, the active antenna facilitates the miniaturization of antennas.

The active antenna requires the supply of power to make the active devices work normally, which requires a power supply line and a signal output line to be separately wired. If the antenna is installed outdoors, water resistance of the antenna should be taken into consideration because gaps are formed between the two lines, which provide an easy access for water. Moreover, installing two lines outdoors is cumbersome, time-consuming and labor-intensive. When the force is applied to any one of the lines, the installation and use of the other line will be influenced, resulting in poor stability. Even if the antenna is installed indoors, the problem of the water resistance is solved, but the existence of two lines will still increase the complexity of indoor line wiring, and the lines will still influence each other.

SUMMARY OF THE INVENTION

It is therefore an object of the present invention to provide an integrated output line capable of outputting a power supply line and a signal output line in combination and an antenna system using the same with good water resistance and convenient installation.

According to the present invention, an integrated output line is provided including a jacket, a power supply line, and a signal output line, the power supply line and the signal output line being disposed through the jacket. The power supply line and the signal output line are combined and output through the jacket, avoiding the generation of gaps between the two lines caused by the two lines in separate wiring, thereby the water resistance is improved and the installation of the lines after combination becomes easier, which is time-saving and labor-saving.

Further, the power supply line includes a negative line and a positive line, and the distance between the signal output line and the negative line is shorter than the distance between the signal output line and the positive line. A shielding effect can be provided since the negative line is equivalent to the ground. Also, through such arrangement, the interference of the positive line to the signal output line can be reduced, and the effect of signal receiving is thus improved.

Further, the signal output line includes a first shield layer and a second shield layer. The two shield layers being arranged contribute to protecting signals from being interfered.

Further, the first shield layer is a braided layer.

Preferably, the braided layer is 96-strand and 12-pick.

Further, the second shield layer is aluminum foil.

Preferably, the aluminum foil is double-sided conductive aluminum foil.

The signal output line further includes a sheath, an insulating layer and an inner conductor. The sheath, the first shield layer, the second shield layer, the insulating layer, and the inner conductor are arranged in sequence from outside to inside.

According to the present invention, an antenna system using the integrated output line is also provided including an antenna, an antenna amplifier, and a power source module. The antenna, the antenna amplifier, and the signal output line are connected in sequence. The antenna amplifier, the power source module, and the power supply line are connected in sequence.

The antenna system further includes a distributor, a signal converting module, and a wireless communication device. The antenna, the antenna amplifier, and the distributor are connected in sequence, the distributor is connected with the signal output line and the signal converting module separately, the signal converting module is connected with the wireless communication device, and the power source module is also connected with the signal converting module and the wireless communication device. Through such arrangement, the signal is divided into wired output and wireless output, which is convenient for users to receive signals flexibly through devices such as televisions, cell phones, and tablet computers.

The antenna system further includes a frequency divider, a broadcast signal amplifier, and a frequency mixer. The antenna is connected with the frequency divider, the frequency divider is connected with the antenna amplifier and the broadcast signal amplifier separately, the antenna amplifier is connected with the distributor, the distributor is connected with the signal converting module and the frequency mixer separately, the broadcast signal amplifier is connected with the frequency mixer, and the frequency mixer is connected with the signal output line. Through such arrangement, broadcast signal can be independently amplified and then mixed to be output, so that the users are enabled to receive the broadcast signal better, which improves user experience.

The antenna system further includes a first power source filter, a second power source filter, and a third power source filter which are connected in sequence. The power source module is connected with the first power source filter; the first power source filter is connected with the signal converting module, the second power source filter is connected with the wireless communication device, and the third power source filter is connected with the antenna amplifier; or the second power source filter is connected with the signal converting module, the first power source filter is connected with the wireless communication device, and the third power source filter is connected with the antenna amplifier. The antenna amplifier, which is the most sensitive to noise, is connected with the third power source filter, that is, the power is supplied by a power source which has been filtered three times, the signal-to-noise ratio of the system is increased.

Compared with the prior art, the present invention offers additional benefits to the existing prior art.

(1) The power supply line and the signal output line are combined and output through the jacket, which can avoid the generation of gaps between the two lines caused by the two lines in separate wiring, thereby the water resistance is improved and the installation of the lines after combination becomes easier, which is time-saving and labor-saving.

(2) Since the negative line is equivalent to the ground, shielding effect can be provided when the negative line is closer to the signal output line. Also, through such arrangement, the interference of the positive line to the signal output line can be reduced, and the effect of signal receiving is thus improved.

(3) The antenna amplifier, which is the most sensitive to noise, is connected with the third power source filter, that is, the power is supplied by a power source that has been filtered three times, the signal-to-noise ratio of the system is increased.

DESCRIPTION OF EMBODIMENTS

The invention will now be described in detail with reference to specific embodiments and drawings.

Embodiment 1

Figure 1:
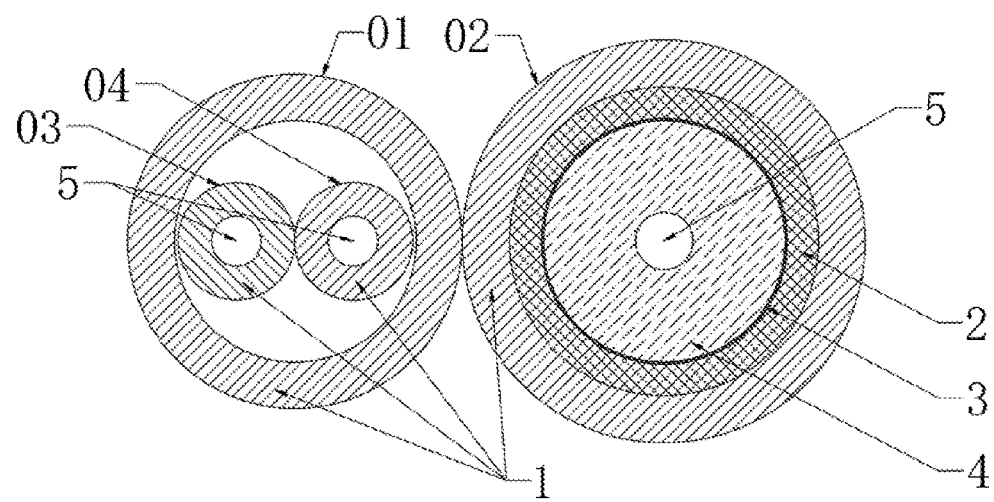
FIG. 1 is a schematic diagram of an embodiment according to the present invention.

An integrated output line as shown in FIG. 1 includes a jacket, a power supply line 01, and a signal output line 02. The power supply line 01 and the signal output line 02 are disposed through the jacket. The power supply line 01 and the signal output line 02 are combined and output through the jacket, avoiding the generation of gaps between the two lines caused by the two lines in separate wiring, thereby the water resistance is improved and the installation of the lines after combination becomes easier, which is time-saving and labor-saving.

The power supply line 01 includes a negative line 04 and a positive line 03, and the distance between the signal output line 02 and the negative line 04 is shorter than the distance between the signal output line 02 and the positive line 03. A shielding effect can be provided since the negative line 04 is equivalent to the ground. Also, through such arrangement, the interference of the positive line 03 to the signal output line can be reduced, and the effect of signal receiving is thus improved.

The signal output line 02 includes a first shield layer 2 and a second shield layer 3. The two shield layers being arranged contribute to protecting signals from being interfered.

The first shield layer 2 is a braided layer braided by 96-strand and 12-pick copper wires. The second shield layer 3 is aluminum foil, specifically double-sided conductive aluminum foil.

The signal output line 02 further includes a sheath 1, an insulating layer 4, and an inner conductor 5. The sheath 1, the first shield layer 2, the second shield layer 3, the insulating layer 4, and the inner conductor 5 are arranged in sequence from outside to inside.

The positive line 03 and the negative line 04 each include a sheath 1 and an inner conductor 5 disposed through the sheath 1.

In a specific implementation process, the sheath 1 is a PVC protective sheath, the insulating layer 4 is made of filled plastic, and the inner conductor 5 is copper wire. The outer diameter of the power supply line 01 is 5 mm. The outer diameters of the positive line 03 and the negative line 04 are both 1.75 mm. The outer diameter of the signal output line 02 is 6 mm, the outer diameter of the second shield layer 3 is 3.6 mm, and the inner diameter of the inner conductor 5 is 0.85 mm.

Embodiment 2

Figure 2:
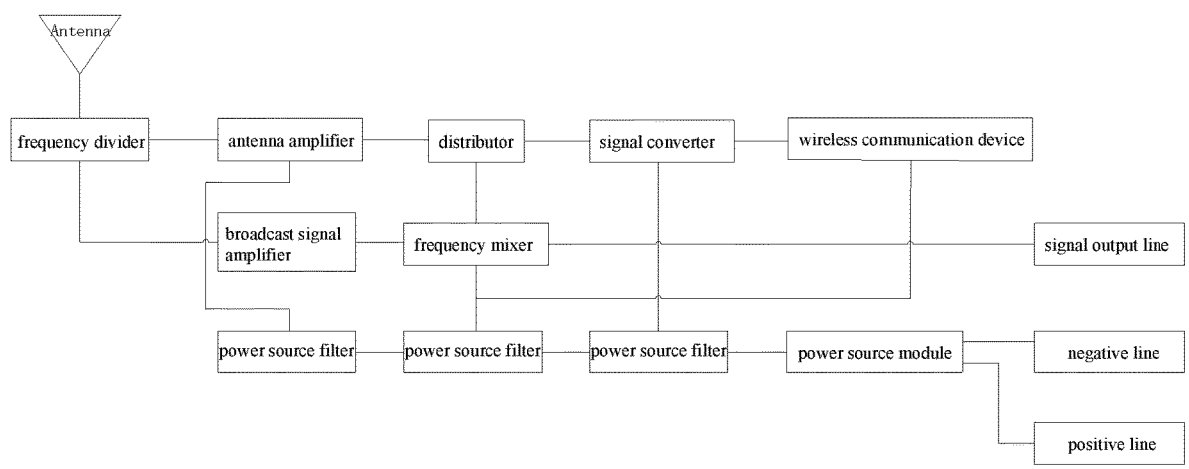
FIG. 2 is a module block diagram of another embodiment according to the present invention.

An antenna system as shown in FIG. 2 including the integrated output line as described in the first embodiment further includes: an antenna, an antenna amplifier, a power source module, a distributor, a signal converting module, a wireless communication device, a frequency divider, a broadcast signal amplifier and a frequency mixer. The antenna is connected with the frequency divider, the frequency divider is connected with the antenna amplifier and the broadcast signal amplifier separately, the antenna amplifier is connected with the distributor, the distributor is connected with the signal converting module and the frequency mixer separately, the signal converting module is connected with the wireless communication device, the broadcast signal amplifier is connected with the frequency mixer, and the frequency mixer is connected with the signal output line. Through such arrangement, the signal is divided into wired output and wireless output, which is convenient for users to receive signals flexibly through devices such as televisions, cell phones, and tablet computers. Also, through such arrangement, a broadcast signal can be independently amplified and then mixed to be output, so that the users are enabled to receive broadcast signal better, which improves user experience.

The antenna system further includes a first power source filter, a second power source filter, and a third power source filter which are connected in sequence. The power source module is connected with the positive line, the negative line, and the first power source filter separately. The first power source filter is connected with the signal converting module, the second power source filter is connected with the wireless communication device, and the third power source filter is connected with the antenna amplifier. The antenna amplifier, which is the most sensitive to noise, is connected with the third power source filter, that is, the power is supplied by a power source that has been filtered three times, the signal-to-noise ratio of the system is increased.

In a specific implementation process, the broadcast signal amplifier is specifically an AM/FM amplifier, the antenna amplifier is specifically a low noise antenna amplifier, the signal converting module is configured to convert TV signal into WIFI signal, and the wireless communication device is specifically a repeater or a router.

The invention claimed is:

1. An integrated output line comprising:
a jacket;
a power supply line; and a signal output line,
wherein the power supply line and the signal output line are disposed through the jacket, wherein the signal output line includes a first shield layer and a second shield layer,
wherein the signal output line further includes:
a sheath:
an insulating layer: and
an inner conductor, and
wherein the sheath, the first shield layer, the second shield layer, the insulating layer, and the inner conductor are arranged in sequence from outside to inside.

2. The integrated output line according to claim 1, wherein the power supply line includes a negative line and a positive line, and the distance between the signal output line and the negative line is shorter than the distance between the signal output line and the positive line.

3. The integrated output line according to claim 1, wherein the first shield layer includes a braided layer.

4. The integrated output line according to claim 1, wherein the second shield layer includes an aluminum foil.

5. An antenna system, comprising:
   the integrated output line according to claim 1;
   an antenna;
   an antenna amplifier; and
   a power source module,
   wherein the antenna, the antenna amplifier, and the signal output line are connected in sequence, and the antenna amplifier, the power source module, and the power supply line are connected in sequence.

6. The antenna system according to claim 5, further comprising:
   a distributor;
   a signal converting module; and
   a wireless communication device,
   wherein the antenna, the antenna amplifier and the distributor are connected in sequence, the distributor is connected with the signal output line and the signal converting module separately, the signal converting module is connected with the wireless communication device, and the power source module is connected with the signal converting module and the wireless communication device.

7. The antenna system according to claim 6, further comprising:
   a frequency divider;
   a broadcast signal amplifier; and
   a frequency mixer,
   wherein the antenna is connected with the frequency divider, the frequency divider is connected with the antenna amplifier and the broadcast signal amplifier separately, the antenna amplifier is connected with the distributor, the distributor is connected with the signal converting module and the frequency mixer separately, the broadcast signal amplifier is connected with the frequency mixer, and the frequency mixer is connected with the signal output line.

8. The antenna system according to claim 6, further comprising:
   a first power source filter;
   a second power source filter; and
   a third power source filter, which are connected in sequence,
   wherein the power source module is connected with the first power source filter; the first power source filter is connected with the signal converting module, the second power source filter is connected with the wireless communication device, and the third power source filter is connected with the antenna amplifier; or the second power source filter is connected with the signal converting module, the first power source filter is connected with the wireless communication device, and the third power source filter is connected with the antenna amplifier.

* * * * *